(12) United States Patent
Khoury et al.

(10) Patent No.: US 10,971,324 B2
(45) Date of Patent: Apr. 6, 2021

(54) TREATMENT METHOD FOR INHIBITING PLATELET ATTACHMENT AND ARTICLES TREATED THEREBY

(71) Applicant: Exogenesis Corporation, Billerica, MA (US)

(72) Inventors: Joseph Khoury, Dedham, MA (US); Sean R. Kirkpatrick, Littleton, MA (US); Michael J. Walsh, Middleton, MA (US); James G. Bachand, Billerica, MA (US); Allen R. Kirkpatrick, Carlisle, MA (US)

(73) Assignee: Exogenesis Corporation, Billerica, MA (US)

( * ) Notice: Subject to any disclaimer, the term of this patent is extended or adjusted under 35 U.S.C. 154(b) by 45 days.

(21) Appl. No.: 15/909,482

(22) Filed: Mar. 1, 2018

(65) Prior Publication Data

US 2018/0190468 A1    Jul. 5, 2018

Related U.S. Application Data

(60) Continuation-in-part of application No. 14/655,361, filed as application No. PCT/US2013/077646 on Dec. 24, 2013, now abandoned, application No. 15/909,482, which is a continuation-in-part of application No. 14/496,412, filed on Sep. 25, 2014, now Pat. No. 10,409,155, which is a division of application No. 13/215,514, filed on Aug. 23, 2011, now Pat. No. 8,847,148.

(60) Provisional application No. 61/746,329, filed on Dec. 27, 2012, provisional application No. 61/757,905, filed on Jan. 29, 2013, provisional application No.
(Continued)

(51) Int. Cl.
| | |
|---|---|
| *H01J 37/05* | (2006.01) |
| *H05H 3/02* | (2006.01) |
| *H01J 37/317* | (2006.01) |
| *H01J 37/147* | (2006.01) |
| *H05H 5/04* | (2006.01) |

(52) U.S. Cl.
CPC ............ *H01J 37/05* (2013.01); *H01J 37/147* (2013.01); *H01J 37/317* (2013.01); *H01J 37/3171* (2013.01); *H05H 3/02* (2013.01); *H05H 5/04* (2013.01); *H01J 2237/0041* (2013.01); *H01J 2237/0812* (2013.01); *H01J 2237/15* (2013.01); *Y10T 428/24355* (2015.01); *Y10T 428/24479* (2015.01); *Y10T 428/30* (2015.01)

(58) Field of Classification Search
CPC ............... H01J 2237/06; H01J 2237/08; H01J 2237/0812; A61F 2/0077; A61F 2/82; A61F 2002/0081; A61F 2002/0086; A61F 2002/009

See application file for complete search history.

(56) References Cited

U.S. PATENT DOCUMENTS

| | | | | |
|---|---|---|---|---|
| 4,713,542 | A * | 12/1987 | Campana | .................. G21K 1/14 |
| | | | | 250/251 |
| 4,935,623 | A * | 6/1990 | Knauer | ..................... H05H 3/02 |
| | | | | 118/715 |

(Continued)

*Primary Examiner* — Todd J Scherbel
(74) *Attorney, Agent, or Firm* — Burns & Levinson LLP; Jerry Cohen

(57) ABSTRACT

A device such as a medical device and a method for making same provides a surface modified by beam irradiation, such as a gas cluster ion beams or a neutral beam, to inhibit or delay attachment or activation or clotting of platelets.

10 Claims, 7 Drawing Sheets

Related U.S. Application Data

61/376,225, filed on Aug. 23, 2010, provisional application No. 61/490,675, filed on May 27, 2011, provisional application No. 61/473,359, filed on Apr. 8, 2011, provisional application No. 61/484,421, filed on May 10, 2011.

(56) References Cited

U.S. PATENT DOCUMENTS

| | | | | |
|---|---|---|---|---|
| 2006/0204534 A1* | 9/2006 | Blinn | ............... | C23C 14/022 |
| | | | | 424/422 |
| 2007/0087034 A1* | 4/2007 | Blinn | ............... | A61P 7/02 |
| | | | | 424/426 |
| 2008/0083908 A1* | 4/2008 | Jang | ............... | H01B 1/22 |
| | | | | 252/500 |
| 2009/0074834 A1* | 3/2009 | Kirkpatrick | ............... | B05D 5/00 |
| | | | | 424/423 |

* cited by examiner

US 10,971,324 B2

TREATMENT METHOD FOR INHIBITING PLATELET ATTACHMENT AND ARTICLES TREATED THEREBY

CROSS-REFERENCE TO RELATED APPLICATIONS

This application is a continuation in part of U.S. application Ser. No. 14/655,361, filed on Jun. 25, 2015 which is a U.S. National Stage Application of International Application No. PCT/US2013/077646 filed on Dec. 24, 2013 and entitled TREATMENT METHOD FOR INHIBITING PLATELET ATTACHMENT AND ARTICLES TREATED THEREBY, which in turn claims priority to and benefit of U.S. Provisional Patent Application No. 61/746,329, filed on Dec. 27, 2012, and U.S. Provisional Patent application No. 61/757,905, filed on Jan. 29, 2013. Additionally, this application is a continuation in part of U.S. application Ser. No. 14/496,412, filed Sep. 25, 2014, which is a divisional of U.S. application Ser. No. 13/215,514, filed on Aug. 23, 2011 and entitled METHOD AND APPARATUS FOR NEUTRAL BEAM PROCESSING BASED ON GAS CLUSTER ION BEAM TECHNOLOGY, which in turn claims priority to and benefit of U.S. Provisional Application No. 61/376,225, filed Aug. 23, 2010, U.S. Provisional Application No. 61/490,675, filed May 27, 2011, U.S. Provisional Application No. 61/473,359, filed Apr. 8, 2011, and U.S. Provisional Application No. 61/484,421, filed May 10, 2011. All of the above recited applications are incorporated by reference herein in their entirety for all purposes.

FIELD OF THE INVENTION

This invention relates generally to methods for treating a surface to inhibit attachment of platelets thereto and to objects with surfaces thus treated and to promote the attachment and/or proliferation of endothelial cells on surfaces. More specifically, it relates to treatment of a surface of an object using a gas-cluster ion-beam (GCIB) or an accelerated Neutral Beam derived from an accelerated GCIB. The Neutral Beam is preferably an accelerated neutral monomer beam derived from a GCIB. The object may be a medical device intended for surgical implant into a subject.

BACKGROUND OF THE INVENTION

Certain medical devices intended for implant in an animal or human subject, in applications where the device contacts blood or blood components may suffer from the problem that platelets attach to and/or activate on the surface of the device, with subsequent formation of or initiation of a blood clot or undesirable attachment of blood components to the device. One example for illustrative purposes is a vascular stent (which may be an expandable metal stent) for insertion into a vascular lumen to treat a disease condition. Such a stent may be formed from a metal material or other material and may, for example, be used to support the lumen of a blood vessel in the vicinity of a cerebral vascular aneurism. In such a case, the tendency for platelet attachment and/or activation, with possible subsequent blood clot formation on the luminal surface of the stent may have the undesired effect of resulting in luminal stenosis or complete obstruction of the blood vessel, resulting in an unfavorable treatment outcome for the implant subject. It is desirable to inhibit or delay the attachment and/or activation of platelets on such surfaces.

In certain cases where inhibition of platelet attachment is beneficial, it is also beneficial to facilitate attachment and/or proliferation of endothelial cells on the surface of an object that may be a medical device such as a stent. Endothelialization of the surface can promote integration of the device following surgical implant, resulting in a more rapid and/or favorable outcome.

In recent years there has been interest in using a GCIB to modify surface properties because of a GCIB's ability to effect very shallow processing while producing very little damage to a substrate.

Ions have long been favored for use in many processes because their electric charge facilitates their manipulation by electrostatic and magnetic fields. This introduces great flexibility in processing. However, in some applications, the charge that is inherent to any ion (including gas-cluster ions in a GCIB) may produce undesirable effects in the processed surfaces. GCIB has a distinct advantage over conventional ion beams in that a gas-cluster ion with a single or small multiple charge enables the transport and control of a much larger mass-flow (a cluster may consist of hundreds or thousands of molecules) compared to a conventional ion (an ionized single atom, molecule, or molecular fragment.) Particularly in the case of insulating materials, surfaces processed using ions often suffer from charge-induced damage resulting from abrupt discharge of accumulated charges, or production of damaging electrical field-induced stress in the material (again resulting from accumulated charges.) In many such cases, GCIBs have an advantage due to their relatively low charge per mass, but in some instances may not eliminate the target-charging problem. Furthermore, moderate to high current intensity ion beams may suffer from a significant space charge-induced defocusing of the beam that tends to inhibit transporting a well-focused beam over long distances. Again, due to their lower charge per mass relative to conventional ion beams, GCIBs have an advantage, but they do not fully eliminate the space charge beam transport problem.

It is therefore an object of this invention to provide methods for treating a surface of an object to inhibit or delay the attachment and/or activation of platelets on the object.

It is another object of this invention to provide methods for treating a surface of an object to inhibit or delay the formation of a blood clot on the object.

It is a further object of this invention to provide medical devices treated to inhibit or delay attachment and/or activation of platelets on a surface thereof.

It is still another object of this invention to provide medical devices treated to inhibit or delay the formation of a blood clot upon a surface thereof.

It is another object of this invention to provide methods for treating a surface of an object to inhibit or delay the formation of a blood clot on the object while simultaneously promoting attachment and/or proliferation of endothelial cells on the object.

It is a further object of this invention to provide a medical device treated to inhibit or delay attachment and/or activation of platelets on a surface thereof while simultaneously promoting attachment and/or proliferation of endothelial cells on the device.

It is still another object of this invention to provide a medical device treated to inhibit or delay the formation of a blood clot upon a surface thereof while simultaneously promoting attachment and/or proliferation of endothelial cells on the device.

SUMMARY OF THE INVENTION

Various embodiments of the present invention are directed to the use of a GCIB or an accelerated Neutral Beam derived from an accelerated GCIB for treating a surface of an object to inhibit or delay the attachment and/or activation of platelets thereon and to inhibit the formation of blood clots on the object and/or further for promoting attachment and/or proliferation of endothelial cells on the object.

One embodiment may include medical devices having surfaces processed by GCIB and/or Neutral Beam that have inhibited or delayed platelet attachment characteristics.

Another embodiment may include medical devices having surfaces processed by GCIB and/or Neutral Beam that have enhanced endothelial cell attachment characteristics.

A further embodiment may include medical devices having some surfaces processed by GCIB and/or Neutral Beam that have inhibited or delayed platelet attachment characteristics and that also have enhanced endothelial cell attachment characteristics.

Yet another embodiment may include medical devices having some surfaces processed by GCIB and/or Neutral Beam that have inhibited or delayed platelet attachment characteristics and other surfaces processed by GCIB and/or Neutral Beam that have enhanced endothelial cell attachment characteristics.

One embodiment of the present invention provides a method of modifying a surface of an object so as to inhibit attachment of platelets thereto, the method comprising: forming a beam derived from a gas-cluster ion-beam in a reduced-pressure chamber; introducing an object into the reduced-pressure chamber; and irradiating at least a portion of the surface of said object with the beam to inhibit attachment of platelets thereto.

The method may further comprise cleaning the portion of said surface prior to irradiating said at least a portion of said surface. The formed beam may be a gas-cluster ion-beam. The formed beam may be a Neutral Beam. The Neutral Beam may be an accelerated neutral monomer beam. The portion of the surface may be adapted to promote the attachment or proliferation of non-platelet cells. The non-platelet cells may be endothelial cells. The object may be a medical device intended for surgical implant into a subject. The portion of the surface may comprise a metal, a ceramic, a polymer, or a glass an oxide, a metal alloy, a plastic, a polymer, a copolymer, a solid resin, a glass, quartz, a ceramic, sapphire, a glassy material, titanium, titania, an alloy of titanium, a cobalt-chrome alloy, a cobalt-chrome-molybdenum alloy, tantalum, or a tantalum alloy. The portion of the surface may comprise nitinol. The platelet attachment inhibition may comprise any of: reduced or delayed attachment; reduced or delayed activation; or reduced or delayed clotting of platelets on the surface. The medical device may be a vascular stent. The formed beam may consist essentially of any of: argon; a mixture of argon with $O_2$; a mixture of argon with $N_2$; or a mixture of argon with $CH_4$.

Another embodiment of the present invention provides a medical device for surgical implant, comprising a device having a surface modified by beam irradiation to inhibit or delay attachment or activation or clotting of platelets. The modified surface may be adapted to promote attachment or proliferation of endothelial cells. The medical device may be a vascular stent. The surface may comprise any of a metal, a ceramic, a polymer, or a glass an oxide, a metal alloy, a plastic, a polymer, a copolymer, a solid resin, a glass, quartz, a ceramic, sapphire, a glassy material, titanium, titania, an alloy of titanium, a cobalt-chrome alloy, a cobalt-chrome-molybdenum alloy, tantalum, or a tantalum alloy. The surface may comprise nitinol. The beam may be a gas-cluster ion-beam or a Neutral Beam.

Methods of forming GCIBs and accelerated GCIBs are known in the prior art. Methods and apparatus for forming Neutral Beams by first forming an accelerated charged GCIB and then neutralizing or arranging for neutralization of at least a fraction of the beam and separating the charged and uncharged fractions are disclosed herein. The Neutral Beams may consist of neutral gas clusters, neutral monomers, or a combination of both. The use of an accelerated Neutral Beam provides a physical surface modification method that may result in a thinner modification of the surface layer of the material processed, and in minimized introduction of charging effects at the surface (especially important when the material is not an electrically conducting material) or when surface charging can harm the material, as for some polymers and other similar materials.

Beams of energetic conventional ions, accelerated electrically charged atoms or molecules, are widely utilized to form semiconductor device junctions, to modify surfaces by sputtering and etching, and to modify the properties of thin films. Unlike conventional ions, gas-cluster ions are formed from clusters of large numbers (having a typical distribution of several hundreds to several thousands with a mean value of a few thousand) of weakly bound atoms or molecules of materials that are gaseous under conditions of standard temperature and pressure (commonly oxygen, nitrogen, or an inert gas such as argon, for example, but any condensable gas can be used to generate gas-cluster ions) with each cluster sharing one or more electrical charges, and which are accelerated together through large electric potential differences (on the order of from about 3 kV to about 70 kV or more) to have high total energies. After gas-cluster ions have been formed and accelerated, their charge states may be altered or become altered (even neutralized) by collisions with other cluster ions, other neutral clusters, or residual background gas particles, and thus they may fragment or may be induced to fragment into smaller cluster ions or into monomer ions and/or into neutralized smaller clusters and neutralized monomers, but the resulting cluster ions, neutral clusters, and monomer ions and neutral monomers tend to retain the relatively high velocities and energies that result from having been accelerated through large electric potential differences, with the accelerated gas-cluster ion energy being distributed over the fragments.

As used herein, the terms "GCIB", "gas-cluster ion-beam" and "gas-cluster ion" are intended to encompass not only ionized beams and ions, but also accelerated beams and ions that have had a portion of their charge states modified (including neutralized) following their acceleration. The terms "GCIB" and "gas-cluster ion-beam" are intended to encompass all beams that comprise accelerated gas-cluster ions even though they may also comprise non-clustered particles. As used herein, the term "Neutral Beam" is intended to mean a beam of neutral gas clusters and/or neutral monomers derived from an accelerated gas-cluster ion-beam and wherein the acceleration results from acceleration of a gas-cluster ion-beam. As used herein, the term "monomer" refers equally to either a single atom or a single molecule. The terms "atom," "molecule," and "monomer" may be used interchangeably and all refer to the appropriate monomer that is characteristic of the gas under discussion (either a component of a cluster, a component of a cluster ion, or an atom or molecule). For example, a monatomic gas like argon may be referred to in terms of atoms, molecules, or monomers and each of those terms means a single atom. Likewise, in the case of a diatomic gas like nitrogen, it may be referred to in terms of atoms, molecules, or monomers, each term meaning a diatomic molecule. Furthermore a molecular gas like $CH_4$, may be referred to in terms of atoms, molecules, or monomers, each term meaning a five atom molecule, and so forth. These conventions are used to simplify generic discussions of gases and gas clusters or gas-cluster ions independent of whether they are monatomic, diatomic, or molecular in their gaseous form.

Because the energies of individual atoms within a large gas-cluster ion are very small, typically a few eV to some tens of eV, the atoms penetrate through, at most, only a few atomic layers of a target surface during impact. This shallow penetration (typically a few nanometers to about ten nanometers, depending on the beam acceleration) of the impacting atoms means all of the energy carried by the entire cluster ion is consequently dissipated in an extremely small volume in a very shallow surface layer during a time period of less than a microsecond. This differs from conventional ion beams where the penetration into the material is sometimes several hundred nanometers, producing changes and material modification deep below the surface of the material. Because of the high total energy of the gas-cluster ion and extremely small interaction volume, the deposited energy density at the impact site is far greater than in the case of bombardment by conventional ions. Accordingly, GCIB modification of a surface tends to produce a shallower region of atomic mixing and has thus been favored as an etching beam for depth profiling in analytical instruments. Neutral Beam processing of a surface can produce even shallower modification of a surface with less surface electrical charging.

When accelerated gas-cluster ions are fully dissociated and neutralized, the resulting neutral monomers will have energies approximately equal to the total energy of the original accelerated gas-cluster ion, divided by the number, $N_I$, of monomers that comprised the original gas-cluster ion at the time it was accelerated. Such dissociated neutral monomers will have energies on the order of from about 1 eV to tens or even as much as a few thousands of eV, depending on the original accelerated energy of the gas-cluster ion and the size of the gas-cluster ion at the time of acceleration.

Gas-cluster ion-beams are generated and transported for purposes of irradiating a workpiece according to known techniques. Various types of holders are known in the art for holding the object in the path of the GCIB for irradiation and for manipulating the object to permit irradiation of a multiplicity of portions of the object. Neutral Beams may be generated and transported for purposes of irradiating a workpiece according to techniques taught herein.

Various embodiments of the present invention may employ a high beam purity method and system for deriving from an accelerated gas-cluster ion-beam an accelerated neutral gas cluster and/or preferably monomer beam that can be employed for a variety of types of surface and shallow subsurface materials processing and which is capable, for many applications, of superior performance compared to conventional GCIB processing. A Neutral Beam apparatus can provide well-focused, accelerated, intense neutral monomer beams with particles having energies in the range of from about 1 eV to as much as a few thousand eV. This is an energy range in which it has heretofore been impractical with simple, relatively inexpensive apparatus to form intense neutral beams.

These accelerated Neutral Beams are generated by first forming a conventional accelerated GCIB, then partly or essentially fully dissociating it by methods and operating conditions that do not introduce impurities into the beam, then separating the remaining charged portions of the beam from the neutral portion, and subsequently using the resulting accelerated Neutral Beam for workpiece processing. Depending on the degree of dissociation of the gas-cluster ions, the Neutral Beam produced may be a mixture of neutral gas monomers and gas clusters or may essentially consist entirely or almost entirely of neutral gas monomers. It is preferred that the accelerated Neutral Beam is a fully dissociated neutral monomer beam.

An advantage of the Neutral Beams that may be produced by the methods and apparatus of this disclosure, is that they may be used to process electrically insulating materials without producing damage to the material due to charging of the surfaces of such materials by beam transported charges as commonly occurs for all ionized beams including GCIB. For example, in some applications, ions often contribute to damaging or destructive charging of thin dielectric films such as oxides, nitrides, etc. The use of Neutral Beams can enable successful beam processing of polymer, dielectric, and/or other electrically insulating or high electrical resistivity materials, coatings, and films in applications where ion beams may produce undesired side effects due to surface or other charging effects. Examples include (without limitation) processing of corrosion inhibiting coatings, and irradiation cross-linking and/or polymerization of organic films. Further examples include Neutral Beam processing of glass, polymer, and ceramic materials as well as thin film dielectric coatings such as oxides, nitrides, glasses, etc.

Another advantage of accelerated neutral monomer beams derived from an accelerated GCIB, when used in surface modification applications, is that they form a much shallower disrupted layer in the processed surface when compared even with GCIBs used in the same way.

Since the parent GCIB, from which accelerated Neutral Beams may be formed by the methods and apparatus of this disclosure, comprises ions it is readily accelerated to desired energy and is readily focused using conventional ion beam techniques. Upon subsequent dissociation and separation of the charged ions from the neutral particles, the neutral beam particles tend to retain their focused trajectories and may be transported for extensive distances with good effect.

When neutral gas clusters in a jet are ionized by electron bombardment, they become heated and/or excited. This may result in subsequent evaporation of monomers from the ionized gas cluster, after acceleration, as it travels down the beamline. Additionally, collisions of gas-cluster ions with background gas molecules in the ionizer, accelerator and beamline regions also heat and excite the gas-cluster ions and may result in additional subsequent evolution of monomers from the gas-cluster ions following acceleration. When these mechanisms for evolution of monomers are induced by electron bombardment and/or collision with background gas molecules (and/or other gas clusters) of the same gas from which the GCIB was formed, no contamination is contributed to the beam by the dissociation processes that results in evolving the monomers.

There are other mechanisms that can be employed for dissociating (or inducing evolution of monomers from) gas-cluster ions in a GCIB without introducing contamination into the beam. Some of these mechanisms may also be employed to dissociate neutral gas-clusters in a neutral gas-cluster beam. One mechanism is laser irradiation of the gas-cluster ion-beam using infra-red or other laser energy. Laser-induced heating of the gas-cluster ions in the laser irradiated GCIB results in excitement and/or heating of the gas-cluster ions and causes subsequent evolution of monomers from the beam. Another mechanism is passing the beam through a thermally heated tube so that radiant thermal energy photons impact the gas-cluster ions in the beam. The induced heating of the gas-cluster ions by the radiant thermal energy in the tube results in excitement and/or heating of the gas-cluster ions and causes subsequent evolution of monomers from the beam. In another mechanism, crossing the gas-cluster ion-beam by a gas jet of the same gas or mixture as the source gas used in formation of the GCIB (or other non-contaminating gas) results in collisions of monomers of the gas in the gas jet with the gas clusters in the ion beam producing excitement and/or heating of the gas-cluster ions in the beam and subsequent evolution of monomers from the excited gas-cluster ions. By depending entirely on electron bombardment during initial ionization and/or collisions (with other cluster ions, or with background gas molecules of the same gas(es) as those used to form the GCIB) within the beam and/or laser or thermal radiation and/or crossed jet collisions of non-contaminating gas to produce the GCIB dissociation and/or fragmentation, contamination of the beam by collision with other materials is avoided.

As a neutral gas-cluster jet from a nozzle travels through an ionizing region where electrons are directed to ionize the clusters, a cluster may remain un-ionized or may acquire a charge state, q, of one or more charges (by ejection of electrons from the cluster by an incident electron). The ionizer operating conditions influence the likelihood that a gas cluster will take on a particular charge state, with more intense ionizer conditions resulting in greater probability that a higher charge state will be achieved. More intense ionizer conditions resulting in higher ionization efficiency may result from higher electron flux and/or higher (within limits) electron energy. Once the gas cluster has been ionized, it is typically extracted from the ionizer, focused into a beam, and accelerated by falling through an electric field. The amount of acceleration of the gas-cluster ion is readily controlled by controlling the magnitude of the accelerating electric field. Typical commercial GCIB processing tools generally provide for the gas-cluster ions to be accelerated by an electric field having an adjustable accelerating potential, $V_{Acc}$, typically of, for example, from about 1 kV to 70 kV (but not limited to that range—$V_{Acc}$ up to 200 kV or even more may be feasible). Thus a singly charged gas-cluster ion achieves an energy in the range of from 1 to 70 keV (or more if larger $V_{Acc}$ is used) and a multiply charged (for example, without limitation, charge state, q=3 electronic charges) gas-cluster ion achieves an energy in the range of from 3 to 210 keV (or more for higher $V_{Acc}$). For other gas-cluster ion charge states and acceleration potentials, the accelerated energy per cluster is $qV_{Acc}$ eV. From a given ionizer with a given ionization efficiency, gas-cluster ions will have a distribution of charge states from zero (not ionized) to a higher number such as, for example, 6 (or with high ionizer efficiency, even more), and the most probable and mean values of the charge state distribution also increase with increased ionizer efficiency (higher electron flux and/or energy). Higher ionizer efficiency also results in increased numbers of gas-cluster ions being formed in the ionizer. In many cases, GCIB processing throughput increases when operating the ionizer at high efficiency results in increased GCIB current. A downside of such operation is that multiple charge states that may occur on intermediate size gas-cluster ions can increase crater and/or rough interface formation by those ions, and often such effects may operate counterproductively to the intent of the processing. Thus for many GCIB surface processing recipes, selection of the ionizer operating parameters tends to involve more considerations than just maximizing beam current. In some processes, use of a "pressure cell" (see U.S. Pat. No. 7,060,989, to Swenson et al.) may be employed to permit operating an ionizer at high ionization efficiency while still obtaining acceptable beam processing performance by moderating the beam energy by gas collisions in an elevated pressure "pressure cell."

With Neutral Beams there is no downside to operating the ionizer at high efficiency—in fact such operation is sometimes preferred. When the ionizer is operated at high efficiency, there may be a wide range of charge states in the gas-cluster ions produced by the ionizer. This results in a wide range of velocities in the gas-cluster ions in the extraction region between the ionizer and the accelerating electrode, and also in the downstream beam. This may result in an enhanced frequency of collisions between and among gas-cluster ions in the beam that generally results in a higher degree of fragmentation of the largest gas-cluster ions. Such fragmentation may result in a redistribution of the cluster sizes in the beam, skewing it toward the smaller cluster sizes. These cluster fragments retain energy in proportion to their new size (N) and so become less energetic while essentially retaining the accelerated velocity of the initial unfragmented gas-cluster ion. The change of energy with retention of velocity following collisions has been experimentally verified (as for example reported in Toyoda, N. et al., "Cluster size dependence on energy and velocity distributions of gas-cluster ions after collisions with residual gas," *Nucl. Instr. & Meth. in Phys. Research* B 257 (2007), pp 662-665). Fragmentation may also result in redistribution of charges in the cluster fragments. Some uncharged fragments likely result and multi-charged gas-cluster ions may fragment into several charged gas-cluster ions and perhaps some uncharged fragments. It is understood by the inventors that design of the focusing fields in the ionizer and the extraction region may enhance the focusing of the smaller gas-cluster ions and monomer ions to increase the likelihood of collision with larger gas-cluster ions in the beam extraction region and in the downstream beam, thus contributing to the dissociation and/or fragmenting of the gas-cluster ions.

In an embodiment of the present invention, background gas pressure in the ionizer, acceleration region, and beamline may optionally be arranged to have a higher pressure than is normally utilized for good GCIB transmission. This can result in additional evolution of monomers from gas-cluster ions (beyond that resulting from the heating and/or excitement resulting from the initial gas cluster ionization event). Pressure may be arranged so that gas-cluster ions have a short enough mean-free-path and a long enough flight path between ionizer and workpiece that they must undergo multiple collisions with background gas molecules.

For a homogeneous gas-cluster ion containing N monomers and having a charge state of q and which has been accelerated through an electric field potential drop of $V_{Acc}$ volts, the cluster will have energy of approximately $qV_{Acc}/N_I$ eV per monomer, where $N_I$ is the number of monomers in the cluster ion at the time of acceleration. Except for the smallest gas-cluster ions, a collision of such an ion with a background gas monomer of the same gas as the cluster source gas will result in additional deposition of approximately $qV_{Acc}/N_I$ eV into the gas-cluster ion. This energy is relatively small compared to the overall gas-cluster ion energy ($qV_{Acc}$) and generally results in excitation or heating of the cluster and in subsequent evolution of monomers from the cluster. It is believed that such collisions of larger clusters with background gas seldom fragment the cluster but rather heats and/or excites it to result in evolution of monomers by evaporation or similar mechanisms. Regardless of the source of the excitation that results in the evolution of a monomer or monomers from a gas-cluster ion, the evolved monomer(s) have approximately the same energy per particle, $qV_{Acc}/N_I$ eV, and retain approximately the same velocity and trajectory as the gas-cluster ion from which they have evolved. When such monomer evolutions occur from a gas-cluster ion, whether they result from excitation or heating due to the original ionization event, a collision, or radiant heating, the charge has a high probability of remaining with the larger residual gas-cluster ion. Thus after a sequence of monomer evolutions, a large gas-cluster ion may be reduced to a cloud of co-traveling monomers with perhaps a smaller residual gas-cluster ion (or possibly several if fragmentation has also occurred). The co-traveling monomers following the original beam trajectory all have approximately the same velocity as that of the original gas-cluster ion and each has energy of approximately $qV_{Acc}/N_I$ eV. For small gas-cluster ions, the energy of collision with a background gas monomer is likely to completely and violently dissociate the small gas cluster and it is uncertain whether in such cases the resulting monomers continue to travel with the beam or are ejected from the beam.

Prior to the GCIB reaching the workpiece, the remaining charged particles (gas-cluster ions, particularly small and intermediate size gas-cluster ions and some charged monomers, but also including any remaining large gas-cluster ions) in the beam are separated from the neutral portion of the beam, leaving only a Neutral Beam for processing the workpiece.

In typical operation, the fraction of power in the neutral beam components relative to that in the full (charged plus neutral) beam delivered at the processing target is in the range of from about 5% to 95%, so by the separation methods and apparatus it is possible to deliver that portion of the kinetic energy of the full accelerated charged beam to the target as a Neutral Beam.

The dissociation of the gas-cluster ions and thus the production of high neutral monomer beam energy is facilitated by 1) Operating at higher acceleration voltages. This increases $qV_{Acc}/N$ for any given cluster size. 2) Operating at high ionizer efficiency. This increases $qV_{Acc}/N$ for any given cluster size by increasing q and increases cluster-ion on cluster-ion collisions in the extraction region due to the differences in charge states between clusters; 3) Operating at a high ionizer, acceleration region, or beamline pressure or operating with a gas jet crossing the beam, or with a longer beam path, all of which increase the probability of background gas collisions for a gas-cluster ion of any given size; 4) Operating with laser irradiation or thermal radiant heating of the beam, which directly promote evolution of monomers from the gas-cluster ions; and 5) Operating at higher nozzle gas flow, which increases transport of gas, clustered and perhaps unclustered into the GCIB trajectory, which increases collisions resulting in greater evolution of monomers.

Measurement of the Neutral Beam cannot be made by current measurement as is convenient for gas-cluster ion-beams. A Neutral Beam power sensor is used to facilitate dosimetry when irradiating a workpiece with a Neutral Beam. The Neutral Beam sensor is a thermal sensor that intercepts the beam (or optionally a known sample of the beam). The rate of rise of temperature of the sensor is related to the energy flux resulting from energetic beam irradiation of the sensor. The thermal measurements must be made over a limited range of temperatures of the sensor to avoid errors due to thermal re-radiation of the energy incident on the sensor. For a GCIB process, the beam power (watts) is equal to the beam current (amps) times $V_{Acc}$, the beam acceleration voltage. When a GCIB irradiates a workpiece for a period of time (seconds), the energy (joules) received by the workpiece is the product of the beam power and the irradiation time. The processing effect of such a beam when it processes an extended area is distributed over the area (for example, $cm^2$). For ion beams, it has been conveniently conventional to specify a processing dose in terms of irradiated ions/$cm^2$, where the ions are either known or assumed to have at the time of acceleration an average charge state, q, and to have been accelerated through a potential difference of, $V_{Acc}$ volts, so that each ion carries an energy of q $V_{Acc}$ eV (an eV is approximately $1.6 \times 10^{-19}$ joule). Thus an ion beam dose for an average charge state, q, accelerated by $V_{Acc}$ and specified in ions/$cm^2$ corresponds to a readily calculated energy dose expressible in joules/$cm^2$. For an accelerated Neutral Beam derived from an accelerated GCIB as utilized herein, the value of q at the time of acceleration and the value of $V_{Acc}$ is the same for both of the (later-formed and separated) charged and uncharged fractions of the beam. The power in the two (neutral and charged) fractions of the GCIB divides proportional to the mass in each beam fraction. Thus for the accelerated Neutral Beam as employed herein, when equal areas are irradiated for equal times, the energy dose (joules/$cm^2$) deposited by the Neutral Beam is necessarily less than the energy dose deposited by the full GCIB. By using a thermal sensor to measure the power in the full GCIB $P_G$ and that in the Neutral Beam $P_N$ (which is commonly found to be about 5% to 95% that of the full GCIB) it is possible to calculate a compensation factor for use in the Neutral Beam processing dosimetry. When $P_N$ is $aP_G$, then the compensation factor is, k=1/a. Thus if a workpiece is processed using a Neutral Beam derived from a GCIB, for a time duration is made to be k times greater than the processing duration for the full GCIB (including charged and neutral beam portions) required to achieve a dose of D ions/$cm^2$, then the energy doses deposited in the workpiece by both the Neutral Beam and the full GCIB are the same (though the results may be different due to qualitative differences in the processing effects due to differences of particle sizes in the two beams.) As used herein, a Neutral Beam process dose compensated in this way is sometimes described as having an energy/$cm^2$ equivalence of a dose of D ions/$cm^2$.

Use of a Neutral Beam derived from a gas-cluster ion-beam in combination with a thermal power sensor for dosimetry in many cases has advantages compared with the use of the full gas-cluster ion-beam or an intercepted or diverted portion, which inevitably comprises a mixture of gas-cluster ions and neutral gas clusters and/or neutral monomers, and which is conventionally measured for dosimetry purposes by using a beam current measurement. Some advantages are as follows:

1) The dosimetry can be more precise with the Neutral Beam using a thermal sensor for dosimetry because the total power of the beam is measured. With a GCIB employing the traditional beam current measurement for dosimetry, only the contribution of the ionized portion of the beam is measured and employed for dosimetry. Minute-to-minute and setup-to-setup changes to operating conditions of the GCIB apparatus may result in variations in the fraction of neutral monomers and neutral clusters in the GCIB. These variations can result in process variations that may be less controlled when the dosimetry is done by beam current measurement.

2) With a Neutral Beam, any material may be processed, including highly insulating materials and other materials that may be damaged by electrical charging effects, without the necessity of providing a source of target neutralizing electrons to prevent workpiece charging due to charge transported to the workpiece by an ionized beam. When employed with conventional GCIB, target neutralization to reduce charging is seldom perfect, and the neutralizing electron source itself often introduces problems such as workpiece heating, contamination from evaporation or sputtering in the electron source, etc. Since a Neutral Beam does not transport charge to the workpiece, such problems are reduced.

3) There is no necessity for an additional device such as a large aperture high strength magnet to separate energetic monomer ions from the Neutral Beam. In the case of conventional GCIB the risk of energetic monomer ions (and other small cluster ions) being transported to the workpiece, where they penetrate producing deep damage, is significant and an expensive magnetic filter is routinely required to separate such particles from the beam. In the case of the Neutral Beam apparatus, the separation of all ions from the beam to produce the Neutral Beam inherently removes all monomer ions.

DETAILED DESCRIPTION OF THE PREFERRED METHODS AND EXEMPLARY EMBODIMENTS

In the following description, for simplification, item numbers from earlier-described figures may appear in subsequently-described figures without discussion. Likewise, items discussed in relation to earlier figures may appear in subsequent figures without item numbers or additional description. In such cases items with like numbers are like items and have the previously-described features and functions, and illustration of items without item numbers shown in the present figure refer to like items having the same functions as the like items illustrated in earlier-discussed numbered figures.

Figure 1:
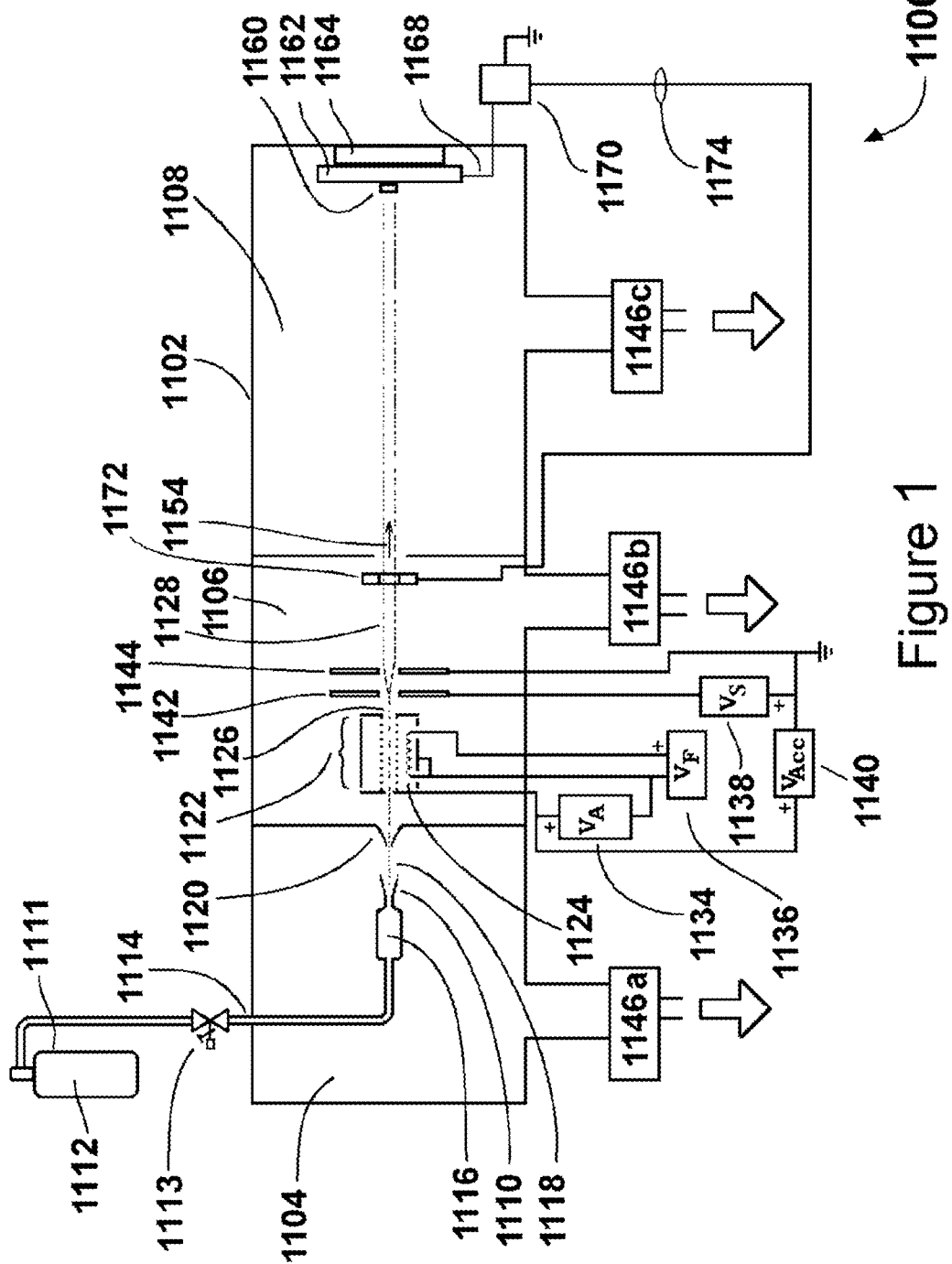
FIG. 1 is a schematic illustrating elements of a GCIB processing apparatus 1100 for processing a workpiece using a GCIB.

Reference is now made to FIG. 1, which shows a schematic configuration for a GCIB processing apparatus 1100. A low-pressure vessel 1102 has three fluidly connected chambers: a nozzle chamber 1104, an ionization/acceleration chamber 1106, and a processing chamber 1108. The three chambers are evacuated by vacuum pumps 1146a, 1146b, and 1146c, respectively. A pressurized condensable source gas 1112 (for example argon) stored in a gas storage cylinder 1111 flows through a gas metering valve 1113 and a feed tube 1114 into a stagnation chamber 1116. Pressure (typically a few atmospheres) in the stagnation chamber 1116 results in ejection of gas into the substantially lower pressure vacuum through a nozzle 1110, resulting in formation of a supersonic gas jet 1118. Cooling, resulting from the expansion in the jet, causes a portion of the gas jet 1118 to condense into clusters, each consisting of from several to several thousand weakly bound atoms or molecules. A gas skimmer aperture 1120 is employed to control flow of gas into the downstream chambers by partially separating gas molecules that have not condensed into a cluster jet from the cluster jet. Excessive pressure in the downstream chambers can be detrimental by interfering with the transport of gas-cluster ions and by interfering with management of the high voltages that may be employed for beam formation and transport. Suitable condensable source gases 1112 include, but are not limited to argon and other condensable noble gases, nitrogen, carbon dioxide, oxygen, and many other gases and/or gas mixtures. After formation of the gas clusters in the supersonic gas jet 1118, at least a portion of the gas clusters are ionized in an ionizer 1122 that is typically an electron impact ionizer that produces electrons by thermal emission from one or more incandescent filaments 1124 (or from other suitable electron sources) and accelerates and directs the electrons, enabling them to collide with gas clusters in the gas jet 1118. Electron impacts with gas clusters eject electrons from some portion of the gas clusters, causing those clusters to become positively ionized. Some clusters may have more than one electron ejected and may become multiply ionized. Control of the number of electrons and their energies after acceleration typically influences the number of ionizations that may occur and the ratio between multiple and single ionizations of the gas clusters. A suppressor electrode 1142, and grounded electrode 1144 extract the cluster ions from the ionizer exit aperture 1126, accelerate them to a desired energy (typically with acceleration potentials of from several hundred V to several tens of kV), and focuses them to form a GCIB 1128. The region that the GCIB 1128 traverses between the ionizer exit aperture 126 and the suppressor electrode 1142 is referred to as the extraction region. The axis (determined at the nozzle 1110), of the supersonic gas jet 1118 containing gas clusters is substantially the same as the axis 1154 of the GCIB 1128. Filament power supply 1136 provides filament voltage $V_f$ to heat the ionizer filament 1124. Anode power supply 1134 provides anode voltage $V_A$ to accelerate thermoelectrons emitted from filament 1124 to cause the thermoelectrons to irradiate the cluster-containing gas jet 1118 to produce cluster ions. A suppression power supply 1138 supplies suppression voltage $V_S$ (on the order of several hundred to a few thousand volts) to bias suppressor electrode 1142. Accelerator power supply 1140 supplies acceleration voltage $V_{Acc}$ to bias the ionizer 1122 with respect to suppressor electrode 1142 and grounded electrode 1144 so as to result in a total GCIB acceleration potential equal to $V_{Acc}$. Suppressor electrode 1142 serves to extract ions from the ionizer exit aperture 1126 of ionizer 1122 and to prevent undesired electrons from entering the ionizer 1122 from downstream, and to form a focused GCIB 1128.

A workpiece 1160, which may (for example) be a medical device, a semiconductor material, an optical element, or other workpiece to be processed by GCIB processing, is held on a workpiece holder 1162, which disposes the workpiece in the path of the GCIB 1128. The workpiece holder is attached to but electrically insulated from the processing chamber 1108 by an electrical insulator 1164. Thus, GCIB 1128 striking the workpiece 1160 and the workpiece holder 1162 flows through an electrical lead 1168 to a dose processor 1170. A beam gate 1172 controls transmission of the GCIB 1128 along axis 1154 to the workpiece 1160. The beam gate 1172 typically has an open state and a closed state that is controlled by a linkage 1174 that may be (for example) electrical, mechanical, or electromechanical. Dose processor 1170 controls the open/closed state of the beam gate 1172 to manage the GCIB dose received by the workpiece 1160 and the workpiece holder 1162. In operation, the dose processor 1170 opens the beam gate 1172 to initiate GCIB irradiation of the workpiece 1160. Dose processor 1170 typically integrates GCIB electrical current arriving at the workpiece 1160 and workpiece holder 1162 to calculate an accumulated GCIB irradiation dose. At a predetermined dose, the dose processor 1170 closes the beam gate 1172, terminating processing when the predetermined dose has been achieved.

Figure 2:
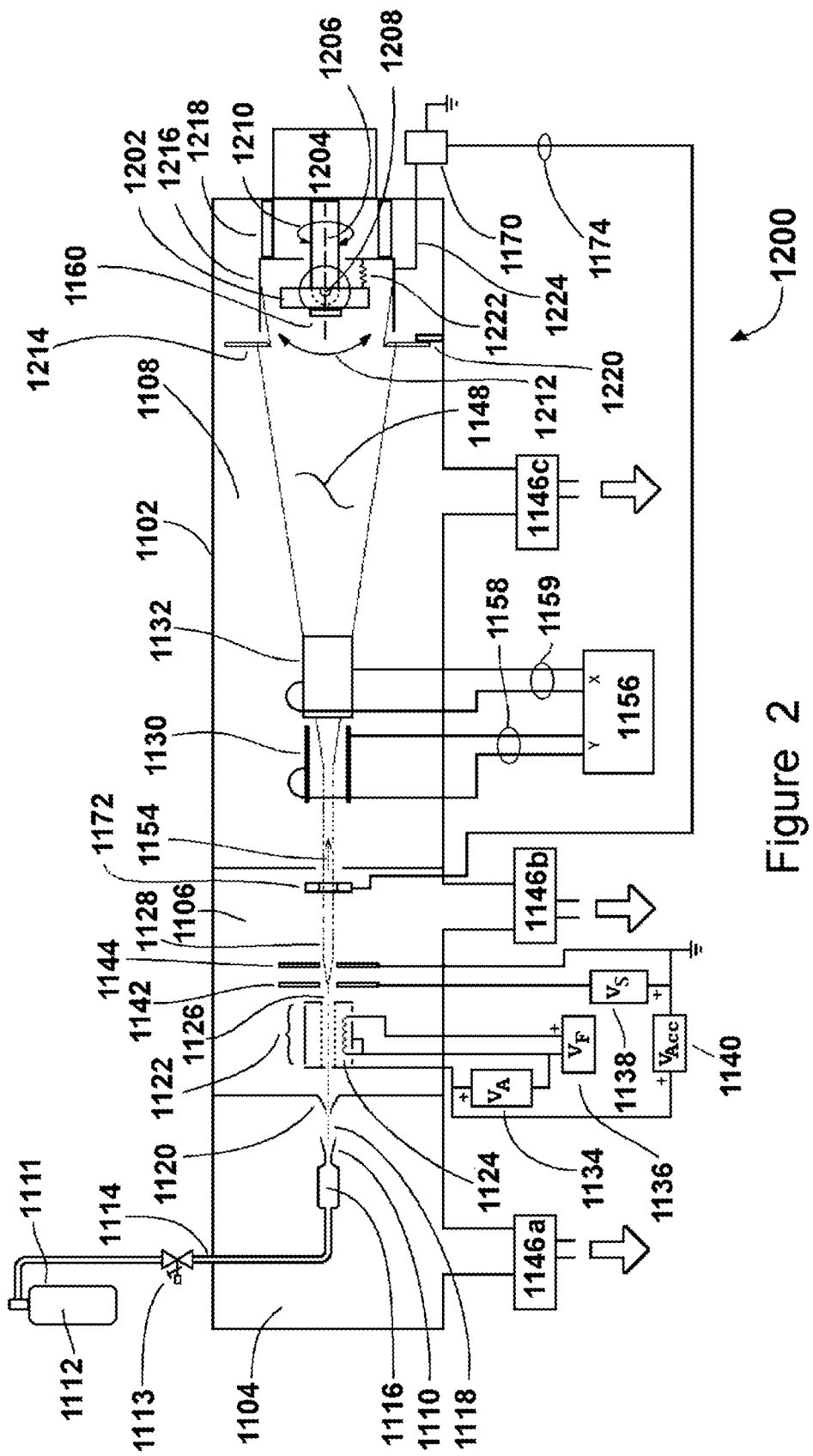
FIG. 2 is a schematic illustrating elements of another GCIB processing apparatus 1200 for workpiece processing using a GCIB, wherein scanning of the ion beam and manipulation of the workpiece is employed.

FIG. 2 shows a schematic illustrating elements of another GCIB processing apparatus 1200 for workpiece processing using a GCIB, wherein scanning of the ion beam and manipulation of the workpiece is employed. A workpiece 1160 to be processed by the GCIB processing apparatus 1200 is held on a workpiece holder 1202, disposed in the path of the GCIB 1128. In order to accomplish uniform processing of the workpiece 1160, the workpiece holder 1202 is designed to manipulate workpiece 1160, as may be required for uniform processing.

Any workpiece surfaces that are non-planar, for example, spherical or cup-like, rounded, irregular, or other un-flat configuration, may be oriented within a range of angles with respect to the beam incidence to obtain optimal GCIB processing of the workpiece surfaces. The workpiece holder 1202 can be fully articulated for orienting all non-planar surfaces to be processed in suitable alignment with the GCIB 1128 to provide processing optimization and uniformity. More specifically, when the workpiece 1160 being processed is non-planar, the workpiece holder 1202 may be rotated in a rotary motion 1210 and articulated in articulation motion 1212 by an articulation/rotation mechanism 1204. The articulation/rotation mechanism 1204 may permit 360 degrees of device rotation about longitudinal axis 1206 (which is coaxial with the axis 1154 of the GCIB 1128) and sufficient articulation about an axis 1208 perpendicular to axis 1206 to maintain the workpiece surface to within a desired range of beam incidence.

Under certain conditions, depending upon the size of the workpiece 1160, a scanning system may be desirable to produce uniform irradiation of a large workpiece. Although often not necessary for GCIB processing, two pairs of orthogonally oriented electrostatic scan plates 1130 and 1132 may be utilized to produce a raster or other scanning pattern over an extended processing area. When such beam scanning is performed, a scan generator 1156 provides X-axis scanning signal voltages to the pair of scan plates 1132 through lead pair 1159 and Y-axis scanning signal voltages to the pair of scan plates 1130 through lead pair 1158. The scanning signal voltages are commonly triangular waves of different frequencies that cause the GCIB 1128 to be converted into a scanned GCIB 1148, which scans the entire surface of the workpiece 1160. A scanned beam-defining aperture 1214 defines a scanned area. The scanned beam-defining aperture 1214 is electrically conductive and is electrically connected to the low-pressure vessel 1102 wall and supported by support member 1220. The workpiece holder 1202 is electrically connected via a flexible electrical lead 1222 to a faraday cup 1216 that surrounds the workpiece 1160 and the workpiece holder 1202 and collects all the current passing through the defining aperture 1214. The workpiece holder 1202 is electrically isolated from the articulation/rotation mechanism 1204 and the faraday cup 1216 is electrically isolated from and mounted to the low-pressure vessel 1102 by insulators 1218. Accordingly, all current from the scanned GCIB 1148, which passes through the scanned beam-defining aperture 1214 is collected in the faraday cup 1216 and flows through electrical lead 1224 to the dose processor 1170. In operation, the dose processor 1170 opens the beam gate 1172 to initiate GCIB irradiation of the workpiece 1160. The dose processor 1170 typically integrates GCIB electrical current arriving at the workpiece 1160 and workpiece holder 1202 and faraday cup 1216 to calculate an accumulated GCIB irradiation dose per unit area. At a predetermined dose, the dose processor 1170 closes the beam gate 1172, terminating processing when the predetermined dose has been achieved. During the accumulation of the predetermined dose, the workpiece 1160 may be manipulated by the articulation/rotation mechanism 1204 to ensure processing of all desired surfaces.

Figure 3:
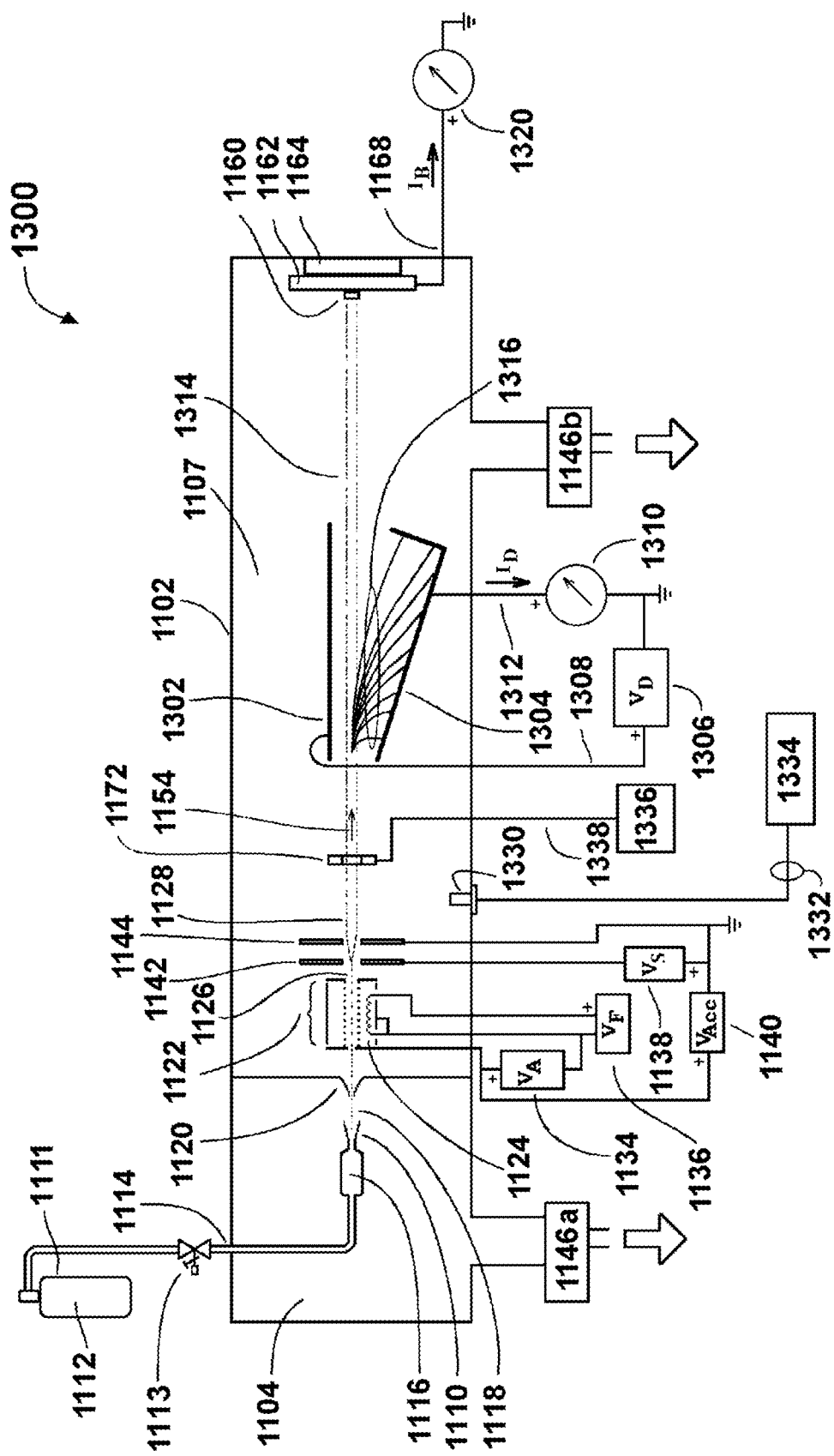
FIG. 3 is a schematic of a Neutral Beam processing apparatus 1300, which uses electrostatic deflection plates to separate the charged and uncharged beams.

FIG. 3 is a schematic of a Neutral Beam processing apparatus 1300 of an exemplary type that may be employed for Neutral Beam processing according to embodiments of the invention. It uses electrostatic deflection plates to separate the charged and uncharged portions of a GCIB. A beamline chamber 1107 encloses the ionizer and accelerator regions and the workpiece processing regions. The beamline chamber 1107 has high conductance and so the pressure is substantially uniform throughout. A vacuum pump 1146*b* evacuates the beamline chamber 1107. Gas flows into the beamline chamber 1107 in the form of clustered and unclustered gas transported by the gas jet 1118 and in the form of additional unclustered gas that leaks through the gas skimmer aperture 1120. A pressure sensor 1330 transmits pressure data from the beamline chamber 1107 through an electrical cable 1332 to a pressure sensor controller 1334, which measures and displays pressure in the beamline chamber 1107. The pressure in the beamline chamber 1107 depends on the balance of gas flow into the beamline chamber 1107 and the pumping speed of the vacuum pump 1146*b*. By selection of the diameter of the gas skimmer aperture 1120, the flow of source gas 1112 through the nozzle 1110, and the pumping speed of the vacuum pump 1146*b*, the pressure in the beamline chamber 1107 equilibrates at a pressure, PB, determined by design and by nozzle flow. The beam flight path from grounded electrode 1144 to workpiece holder 162, is for example, 100 cm. By design and adjustment PB may be approximately $6 \times 10^{-5}$ torr ($8 \times 10^{-3}$ pascal). Thus the product of pressure and beam path length is approximately $6 \times 10^{-3}$ torr-cm (0.8 pascal-cm) and the gas target thickness for the beam is approximately $1.94 \times 10^{14}$ gas molecules per cm$^2$, which is observed to be effective for dissociating the gas-cluster ions in the GCIB 1128. $V_{Acc}$ may be for example 30 kV and the GCIB 1128 is accelerated by that potential. A pair of deflection plates (1302 and 1304) is disposed about the axis 1154 of the GCIB 1128. A deflector power supply 1306 provides a positive deflection voltage $V_D$ to deflection plate 1302 via electrical lead 1308. Deflection plate 1304 is connected to electrical ground by electrical lead 1312 and through current sensor/display 1310. Deflector power supply 1306 is manually controllable. $V_D$ may be adjusted from zero to a voltage sufficient to completely deflect the ionized portion 1316 of the GCIB 1128 onto the deflection plate 1304 (for example a few thousand volts). When the ionized portion 1316 of the GCIB 1128 is deflected onto the deflection plate 1304, the resulting current, $I_D$ flows through electrical lead 1312 and current sensor/display 1310 for indication. When $V_D$ is zero, the GCIB 1128 is undeflected and travels to the workpiece 1160 and the workpiece holder 1162. The GCIB beam current $I_B$ is collected on the workpiece 1160 and the workpiece holder 1162 and flows through electrical lead 1168 and current sensor/display 1320 to electrical ground. $I_B$ is indicated on the current sensor/display 1320. A beam gate 1172 is controlled through a linkage 1338 by beam gate controller 1336. Beam gate controller 1336 may be manual or may be electrically or mechanically timed by a preset value to open the beam gate 1172 for a predetermined interval. In use, $V_D$ is set to zero and the beam current, $I_B$, striking the workpiece holder is measured. Based on previous experience for a given GCIB process recipe, an initial irradiation time for a given process is determined based on the measured current, $I_B$. $V_D$ is increased until all measured beam current is transferred from $I_B$ to $I_D$ and $I_D$ no longer increases with increasing $V_D$. At this point a Neutral Beam 1314 comprising energetic dissociated components of the initial GCIB 1128 irradiates the workpiece holder 1162. The beam gate 1172 is then closed and the workpiece 1160 placed onto the workpiece holder 1162 by conventional workpiece loading means (not shown). The beam gate 1172 is opened for the predetermined initial radiation time. After the irradiation interval, the workpiece may be examined and the processing time adjusted as necessary to calibrate the duration of Neutral Beam processing based on the measured GCIB beam current $I_B$. Following such a calibration process, additional workpieces may be processed using the calibrated exposure duration.

The Neutral Beam 1314 contains a repeatable fraction of the initial energy of the accelerated GCIB 1128. The remaining ionized portion 1316 of the original GCIB 1128 has been removed from the Neutral Beam 1314 and is collected by the grounded deflection plate 1304. The ionized portion 1316 that is removed from the Neutral Beam 1314 may include monomer ions and gas-cluster ions including intermediate size gas-cluster ions. Because of the monomer evaporation mechanisms due to cluster heating during the ionization process, intra-beam collisions, background gas collisions, and other causes (all of which result in erosion of clusters) the Neutral Beam substantially consists of neutral monomers, while the separated charged particles are predominately cluster ions. The inventors have confirmed this by suitable measurements that include re-ionizing the Neutral Beam and measuring the charge to mass ratio of the resulting ions. As will be shown below, certain superior process results are obtained by processing workpieces using this Neutral Beam.

Figure 4:
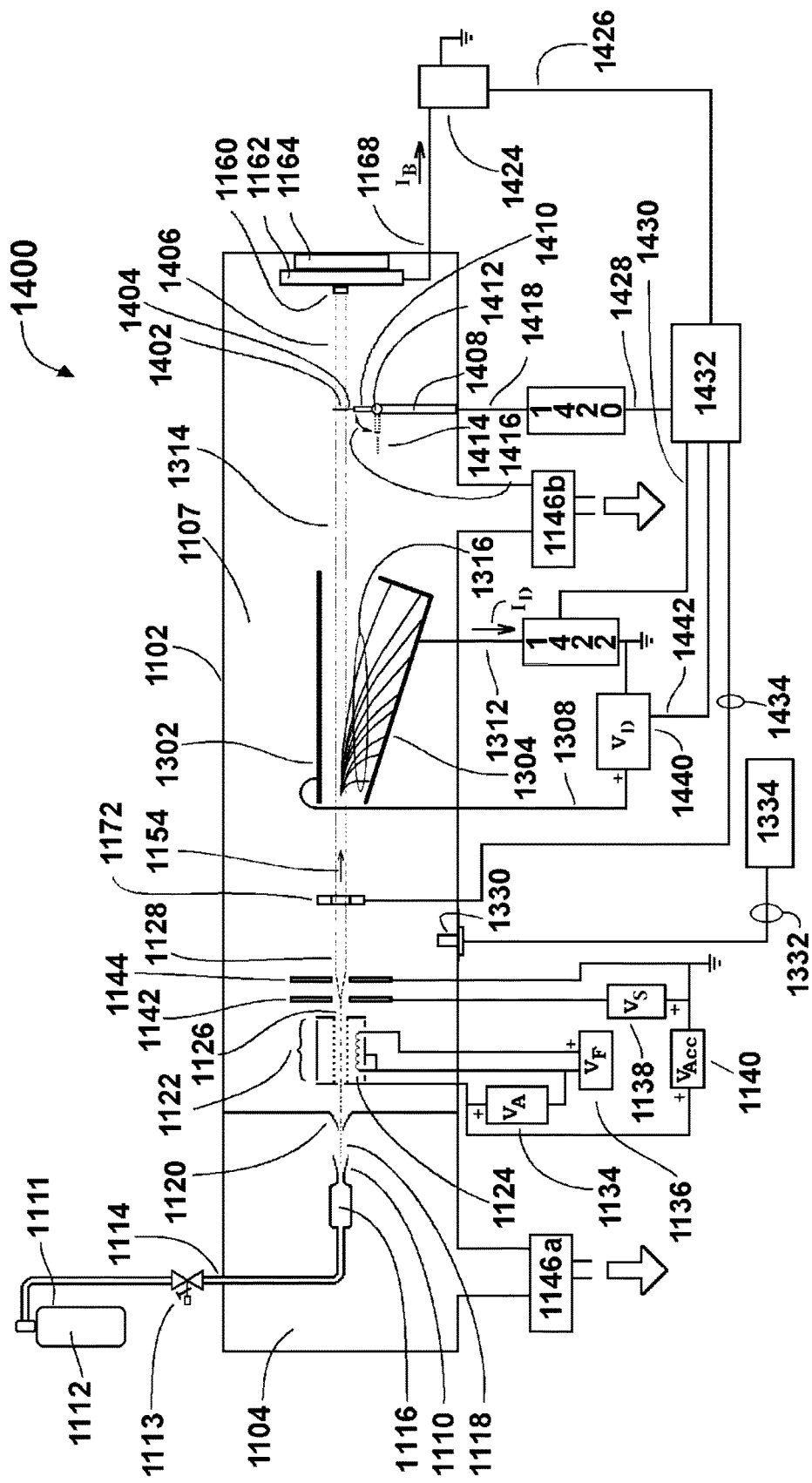
FIG. 4 is a schematic of a Neutral Beam processing apparatus 1400 using a thermal sensor for Neutral Beam measurement.

FIG. 4 is a schematic of a Neutral Beam processing apparatus 1400 as may, for example, be used in generating Neutral Beams as may be employed in embodiments of the invention. It uses a thermal sensor for Neutral Beam measurement. A thermal sensor 1402 attaches via low thermal conductivity attachment 1404 to a rotating support arm 1410 attached to a pivot 1412. Actuator 1408 moves thermal sensor 1402 via a reversible rotary motion 1416 between positions that intercept the Neutral Beam 1314 or GCIB 1128 and a parked position indicated by 1414 where the thermal sensor 1402 does not intercept any beam. When thermal sensor 1402 is in the parked position (indicated by 1414) the GCIB 1128 or Neutral Beam 1314 continues along path 1406 for irradiation of the workpiece 1160 and/or workpiece holder 1162. A thermal sensor controller 1420 controls positioning of the thermal sensor 1402 and performs processing of the signal generated by thermal sensor 1402. Thermal sensor 1402 communicates with the thermal sensor controller 1420 through an electrical cable 1418. Thermal sensor controller 1420 communicates with a dosimetry controller 1432 through an electrical cable 1428. A beam current measurement device 1424 measures beam current $I_B$ flowing in electrical lead 1168 when the GCIB 1128 strikes the workpiece 1160 and/or the workpiece holder 1162. Beam current measurement device 1424 communicates a beam current measurement signal to dosimetry controller 1432 via electrical cable 1426. Dosimetry controller 1432 controls setting of open and closed states for beam gate 1172 by control signals transmitted via linkage 1434. Dosimetry controller 1432 controls deflector power supply 1440 via electrical cable 1442 and can control the deflection voltage $V_D$ between voltages of zero and a positive voltage adequate to completely deflect the ionized portion 1316 of the GCIB 1128 to the deflection plate 1304. When the ionized portion 1316 of the GCIB 1128 strikes deflection plate 1304, the resulting current $I_D$ is measured by current sensor 1422 and communicated to the dosimetry controller 1432 via electrical cable 1430. In operation dosimetry controller 1432 sets the thermal sensor 1402 to the parked position 1414, opens beam gate 1172, and sets $V_D$ to zero so that the full GCIB 1128 strikes the workpiece holder 1162 and/or workpiece 1160. The dosimetry controller 1432 records the beam current $I_B$ transmitted from beam current measurement device 1424. The dosimetry controller 1432 then moves the thermal sensor 1402 from the parked position 1414 to intercept the GCIB 1128 by commands relayed through thermal sensor controller 1420. Thermal sensor controller 1420 measures the beam energy flux of GCIB 1128 by calculation based on the heat capacity of the sensor and measured rate of temperature rise of the thermal sensor 1402 as its temperature rises through a predetermined measurement temperature (for example 70 degrees C.) and communicates the calculated beam energy flux to the dosimetry controller 1432 which then calculates a calibration of the beam energy flux as measured by the thermal sensor 1402 and the corresponding beam current measured by the beam current measurement device 1424. The dosimetry controller 1432 then parks the thermal sensor 1402 at parked position 1414, allowing it to cool and commands application of positive $V_D$ to deflection plate 1302 until the entire current $I_D$ due to the ionized portion of the GCIB 1128 is transferred to the deflection plate 1304. The current sensor 1422 measures the corresponding $I_D$ and communicates it to the dosimetry controller 1432. The dosimetry controller also moves the thermal sensor 1402 from parked position 1414 to intercept the Neutral Beam 1314 by commands relayed through thermal sensor controller 420. Thermal sensor controller 420 measures the beam energy flux of the Neutral Beam 1314 using the previously determined calibration factor and the rate of temperature rise of the thermal sensor 1402 as its temperature rises through the predetermined measurement temperature and communicates the Neutral Beam energy flux to the dosimetry controller 1432. The dosimetry controller 1432 calculates a neutral beam fraction, which is the ratio of the thermal measurement of the Neutral Beam 1314 energy flux to the thermal measurement of the full GCIB 1128 energy flux at sensor 1402. Under typical operation, a neutral beam fraction of from about 5% to about 95% is achieved. Before beginning processing, the dosimetry controller 1432 also measures the current, $I_D$, and determines a current ratio between the initial values of $I_B$ and $I_D$. During processing, the instantaneous $I_D$ measurement multiplied by the initial $I_B/I_D$ ratio may be used as a proxy for continuous measurement of the $I_B$ and employed for dosimetry during control of processing by the dosimetry controller 1432. Thus the dosimetry controller 1432 can compensate any beam fluctuation during workpiece processing, just as if an actual beam current measurement for the full GCIB 1128 were available. The dosimetry controller uses the neutral beam fraction to compute a desired processing time for a particular beam process. During the process, the processing time can be adjusted based on the calibrated measurement of $I_D$ for correction of any beam fluctuation during the process.

In an exemplary embodiment of the invention, nickel titanium alloy, also known as nitinol, a material favored for certain types of vascular stents was treated by GCIB and Neutral Beam processing to inhibit or delay the attachment and/or activation of platelets on surfaces thereof and to inhibit subsequent formation of blood clots.

Electro-polished and cleaned nitinol coupons (10 mm diameter, 1 mm thick) were divided into the following groups (n=3 for each condition): 1) Unprocessed (except for cleaning) control; 2) cleaned and argon Neutral-Beam-processed; 3) cleaned and argon GCIB-processed; 4) cleaned and Neutral-Beam-processed using each of several source gas mixtures (each of $CH_4$, $O_2$, $N_2$) each used at 10%, 5%, 2%, 1% mixture concentration with the balance argon; 5) GCIB processed using each of several source gas mixtures (each of $CH_4$, $O_2$, $N_2$) each used at 10%, 5%, 2%, 1% mixture concentration with the balance argon.

For each GCIB treatment, a surface of the coupon was irradiated using a GCIB (gas or mixture indicated above) irradiation dose of $5 \times 10^{14}$ gas-cluster ions/$cm^2$, the beam was accelerated using $V_{Acc}$ of 30 keV. For each Neutral Beam treatment, a surface of the coupon was irradiated using a Neutral Beam (gas or mixture indicated above) irradiation dose of $2.5 \times 10^{17}$ neutral atoms/$cm^2$, the parent GCIB was accelerated using $V_{Acc}$ of 30 keV. The Neutral Beam was an essentially fully dissociated beam. The Neutral Beam dose of $2.5 \times 10^{17}$ neutral atoms/$cm^2$ was determined to be approximately the thermal equivalent of the $5 \times 10^{14}$ gas-cluster ions/$cm^2$.

Each of the nitinol coupons (controls and all processed conditions) were placed in individual wells of non-tissue culture plates treated 24 well plates (BD Falcon 351147). 500 µl of citrated human whole blood was placed in each well and the plates (with blood and coupons) were incubated for one hour at 37° C., 5% $CO_2$ in humidified air. Blood, all taken from the same batch, was used in each well. Following incubation, the blood was removed from the wells and all coupons were gently rinsed 3 times with 500 µl 1× phosphate buffered saline (PBS). Washed coupons were then fixed in 2% gluteraldehyde in PBS buffer with a pH of 7.4 for 1 hour. Each coupon was then rinsed three times in 500 µl PBS for 5 minutes. Nitinol coupons were then fixed in a secondary fixative using 1% osmium tetra-oxide ($O_sO_4$) in $H_2O$. They were then rinsed 3 times with distilled water for 5 minutes each. Following the washes, coupons were serially dehydrated in 30%, 50%, 70%, 90% ethanol concentration, 5 minutes each, followed by 2 times of 5 minutes in 100% ethanol. Coupons were then gold sputter-coated and imaged by scanning electron microscope (SEM).

In each instance the GCIB- or Neutral-Beam-processed (using argon alone or one of the gas mixtures) coupons showed reduced platelet attachment and/or activation and reduced clotting as compared to the control coupons. For this set of tests, the best results for both GCIB and Neural Beam treatment were obtained using a $CH_4$/argon mixture at a concentration of 2.5% and 5% (both concentration results approximately the same) as the source gas employed for beam generation.

Figure 5:
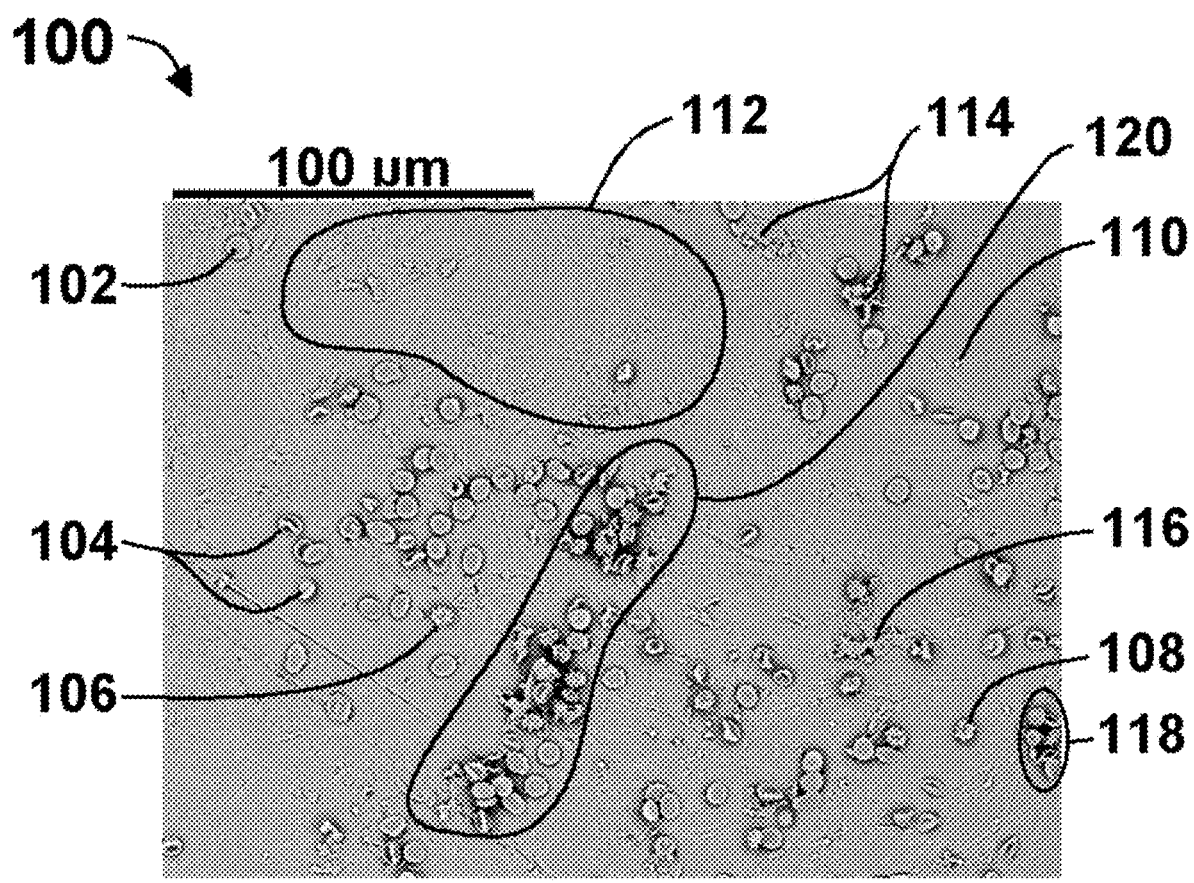
FIG. 5 is a typical SEM image 100 of a surface of a nitinol coupon from an untreated control group showing substantial progression toward platelet attachment, activation, and clot formation.

FIG. 5 is a typical SEM image 100 of a surface of a nitinol coupon from the control group. Individual erythrocytes (102, 104 indicated as examples), and leukocytes (106, 108 indicated as examples) are scattered throughout the field. Individual platelets (110 indicated as an example) and large areas of activated platelets (112 indicated as an example) interconnected by fibrin networks are widely observed. Substantial platelet agglutinations (114, 116 indicated as examples) indicate progression towards clotting. Clusters (118, 120) of erythrocytes, leukocytes, and activated platelets show instances of clotting progression.

Figure 6:
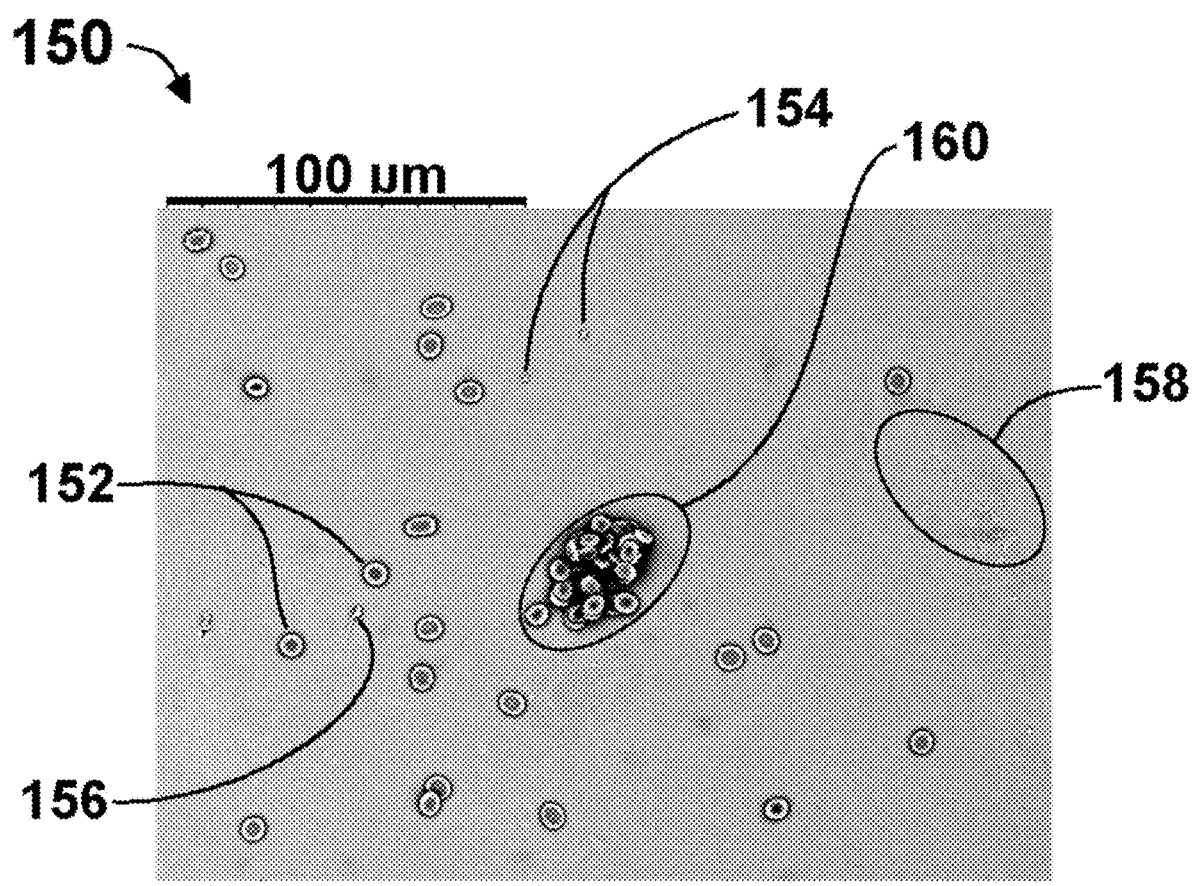
FIG. 6 is a typical SEM image 150 of a surface of a nitinol coupon from a Neutral-Beam-treated group showing noticeable inhibition of platelet attachment, activation, and clot formation, according to an embodiment of the invention.

FIG. 6 is a typical SEM image 150 of a surface of a nitinol coupon from the Neutral-Beam-processed group using a source gas mixture of 5% $CH_4$ in argon. Individual erythrocytes (152 indicated as examples) are scattered throughout the field. Individual platelets (154 indicated as examples), occasional partially activated platelets (156 indicated as an example), and small areas of activated platelets (158 indicated as an example) interconnected by fibrin networks are occasionally observed. Occasional clusters (160) of erythrocytes, leukocytes, and activated platelets show instances of clotting progression. In general the progression of platelet attachment, activation, and clot formation is noticeably less advanced than the control case.

Figure 7:
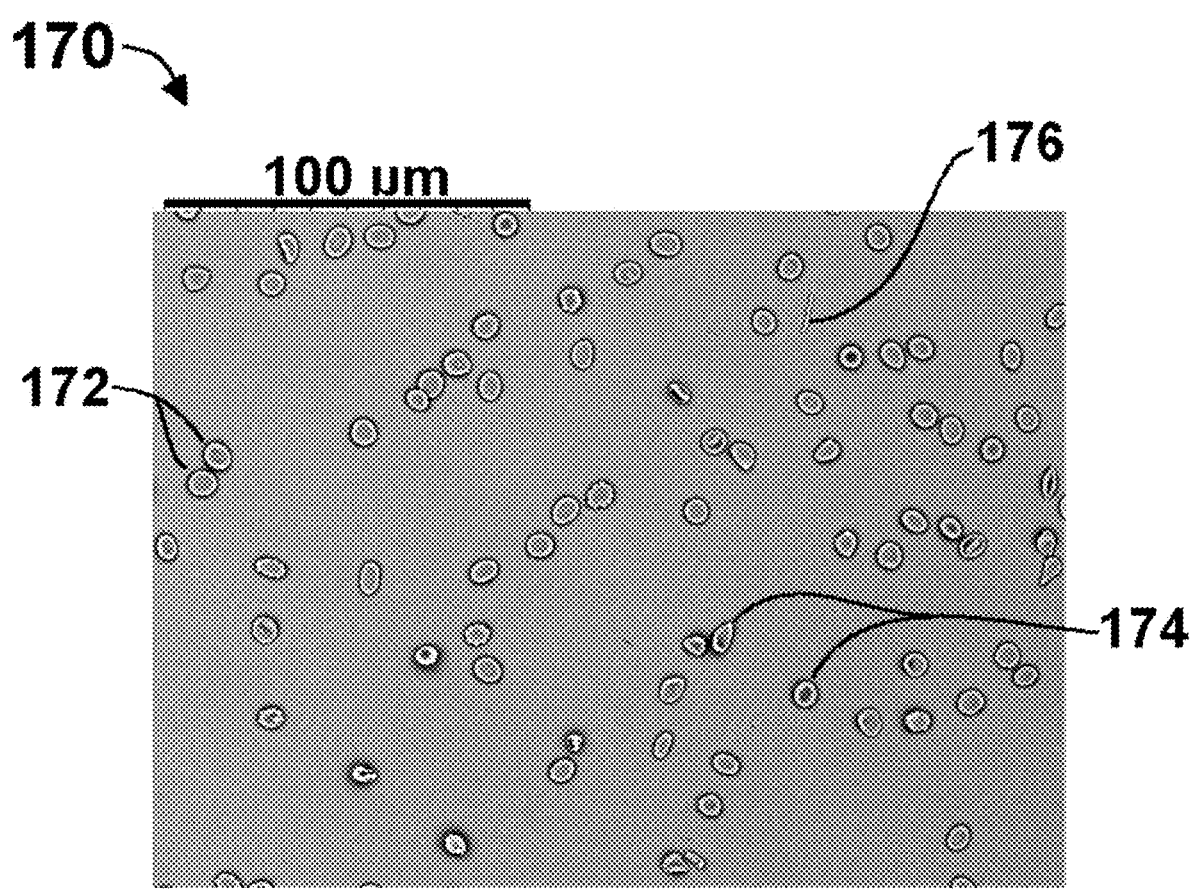
FIG. 7 is a typical SEM image 170 of a surface of a nitinol coupon from a GCIB-treated group showing substantial inhibition of platelet attachment, activation, and clot formation, according to an embodiment of the invention.

FIG. 7 is a typical SEM image 170 of a surface of a nitinol coupon from the GCIB-processed group using a source gas mixture of 5% $CH_4$ in argon. Individual erythrocytes (172, 174 indicated as examples) are scattered throughout the field. Occasional individual platelets and partially activated platelets (176 indicated as an example) are observed. Small areas of activated platelets and preliminary clusters of clot formations are seldom observed (no examples in this field). The progression of platelet attachment, activation, and clot formation is substantially less advanced than either the control case or the Neutral-Beam-processed case.

In another test, nitinol was treated by GCIB and Neutral Beam processing to determine the effects of the beam processing on subsequent attachment and/or proliferation of endothelial cells on the surface.

Electro-polished and cleaned nitinol coupons (10 mm diameter, 1 mm thick) were divided into the following groups (n=3 for each condition): 1) Unprocessed (except for cleaning) control; 2) cleaned and argon Neutral-Beam-processed; 3) cleaned and argon GCIB-processed; 4) cleaned and Neutral-Beam-processed using each of several source gas mixtures (each of $CH_4$, $O_2$, $N_2$) each used at 5% and 1% mixture concentration with the balance argon; 5) GCIB processed using each of several source gas mixtures (each of $CH_4$, $O_2$, $N_2$) each used at 5% and 1% mixture concentration with the balance argon.

For each GCIB treatment, a surface of the coupon was irradiated using a GCIB (gas or mixture indicated above) irradiation dose of $5 \times 10^{14}$ gas-cluster ions/$cm^2$, the beam was accelerated using $V_{Acc}$ of 30 keV. For each Neutral Beam treatment, a surface of the coupon was irradiated using a Neutral Beam (gas or mixture indicated above) irradiation dose of $2.5 \times 10^{17}$ neutral atoms/cm$^2$, the parent GCIB was accelerated using $V_{Acc}$ of 30 keV. The Neutral Beam was an essentially fully dissociated beam. The Neutral Beam dose of $2.5 \times 10^{17}$ neutral atoms/cm$^2$ was determined to be approximately the thermal equivalent of the $5 \times 10^{14}$ gas-cluster ions/cm$^2$.

Each of the nitinol coupons (controls and all processed conditions) were placed in individual wells of non-tissue culture plates treated 24 well plates (BD Falcon 351147). Each nitinol coupon was seeded with 2000 human umbilical vein endothelial cells (HUVEC; Lonza Group Ltd, Muenchensteinerstrasse 38, CH-4002, Basel, Switzerland; Lonza # C2519A) in 1 ml of endothelial cell growth media (Lonza EGM-2), and the plates (with media and coupons) were incubated at 37° C., 5% $CO_2$ in humidified air. Media in the wells was changed every 3 days. At day 7 and day 10, plates corresponding to those time points were removed, media was removed, cells were fixed for 30 minutes in 500 µl 10% buffered formalin at room temperature. Formalin was removed and 500 µl crystal violet stain (Sigma # HT90132; diluted 1:100 in 1× phosphate buffered saline) was added to each well and placed on a shaker with gentle agitation for 30 minutes. Crystal violet stain was removed and excess stain was washed off in tap water until clear. Nitinol coupons were then air dried overnight, 500 µl elution buffer (2% NaOH; 10% Trichloroacetic acid; 50% Methanol; in $H_2O$) was placed in each well to allow dye elution from coupons. 100 µl samples of each well in duplicates (two samples from each well, thus 6 samples per condition [2×n]) were placed in a 96 well plate and absorbance at 570 nm for each well was read on a plate reader. Absorbance was compared to a standard curve and cell numbers were determined. T-tests were used to determine significance compared to controls. Endothelial cells attached and proliferated on the surface of nitinol coupons treated by either argon or mixtures of Argon with $CH_4$, $O_2$, or $N_2$ using either GCIB or Neutral Beam. However, the best results were obtained using GCIB, and Table 1 shows the results for the GCIB-processed coupon.

TABLE 1

| GCIB Process | Day 7 Cell Count | Day 7 Std. Deviation | Day 7 p value | Day 10 Cell Count | Day 10 Std. Deviation | Day 10 p value |
|---|---|---|---|---|---|---|
| Control | 18083 | 4867 | | 15458 | 6096 | |
| Argon GCIB | 24958 | 3333 | 0.037 | 28708 | 8247 | 0.014 |
| 1% $CH_4$ in Ar GCIB | 24625 | 1794 | 0.0041 | 21417 | 2078 | 0.015 |
| 5% $CH_4$ in Ar GCIB | 19000 | 4990 | 0.80 | 20958 | 1706 | 0.043 |
| 1% $O_2$ in Ar GCIB | 17125 | 3364 | 0.21 | 17167 | 8323 | 0.59 |
| 5% $O_2$ in Ar GCIB | 13667 | 3459 | 0.11 | 32792 | 2813 | 0.00073 |
| 1% $N_2$ in Ar GCIB | 10500 | 7112 | 0.18 | 35000 | 5282 | 0.0025 |
| 5% $N_2$ in Ar GCIB | 13625 | 8130 | 0.377692 | 34583 | 3289 | 0.001872 |

Generally, GCIB allowed better HUVEC attachment and proliferation as compared with Neutral Beam. As Table 1 shows, at day 7, only Argon GCIB and $CH_4$ 1% GCIB were significantly better than the control, all others were not significantly different from controls. By day 10, only $O_2$ 1% GCIB did not produce significant increase in HUVEC attachment and proliferation compared to the controls, all others were significantly better.

The best results for platelet and clotting inhibition were observed for GCIB treatment using $CH_4$ mixtures in argon while the best results for endothelial cell attachment and proliferation were observed for GCIB treatment using $N_2$ or $O_2$ mixtures in argon. However, it is seen that nitinol coupons receiving identical GCIB processing using 5% $CH_4$, 5% $O_2$, or 5% $N_2$ mixtures in argon all show significant platelet delay and/or inhibition as well as significantly enhanced endothelial cell attachment and/or proliferation. Other combinations also produce both desirable outcomes using either GCIB or Neutral Beam treatments.

Although the invention has been described, for exemplary purposes, as using a GCIB or a Neutral Beam derived from a GCIB for processing a surface of a nitinol object, it is understood by the inventors that benefits obtained by application of such surface processing are not limited to that specific metallic material and that the methods and apparatus described herein may be used for successful processing of other metals and other materials including, without limitation, ceramics, polymers, glasses, oxides, metal alloys, plastics, polymers and copolymers, solid resins, quartz, sapphire, glassy solids, titanium, titania, alloys of titanium, cobalt-chrome alloys, cobalt-chrome-molybdenum alloys, tantalum, and tantalum alloys. Although the invention has been described, for example, with reference beams derived from mixtures of argon and methane gases, it is understood by the inventors that useful treatments also result from employing noble gases, gases such as $N_2$, $O_2$, $CO_2$, and other gases and from employing gas mixtures in various mixture concentrations, and it is intended that all such applications are included within the scope of the invention.

Although the invention has been described with respect to various embodiments, it should be realized that this invention is also capable of a wide variety of further and other embodiments within the spirit and scope of the invention.

What is claimed is:

1. A method of modifying a surface of a medical device object so as to inhibit attachment of platelets thereto, the method comprising:
   forming a Neutral Beam of monomers derived from a gas-cluster ion-beam which is accelerated in a reduced-pressure chamber and treated for dissociation to establish monomers content by separating charged particles and clusters therefrom;
   introducing said medical device object into the reduced-pressure chamber;
   and irradiating at least a portion of the surface of said medical device object with the Neutral Beam to inhibit attachment of platelets thereto.

2. The method of claim 1, further comprising cleaning said at least a portion of said surface prior to irradiating said at least a portion of said surface.

3. The method of claim 1, wherein the at least a portion of the surface modified to inhibit the attachment of platelets thereto is adapted to promote the attachment or proliferation of non-platelet cells.

4. The method of claim 3, wherein the non-platelet cells are endothelial cells.

5. The method of claim 1, wherein the object is a medical device intended for surgical implant into a subject.

6. The method of claim 5 wherein the medical device is a vascular stent.

7. The method of claim 1, wherein the at least a portion of the surface comprises a metal, a ceramic, a polymer, or a glass an oxide, a metal alloy, a plastic, a polymer, a copolymer, a solid resin, a glass, quartz, a ceramic, sapphire, a glassy material, titanium, titania, an alloy of titanium, a cobalt-chrome alloy, a cobalt-chrome-molybdenum alloy, tantalum, or a tantalum alloy.

8. The method of claim 1, wherein the at least a portion of the surface comprises nitinol.

9. The method of claim 1, wherein platelet attachment inhibition comprises any of: reduced or delayed attachment; reduced or delayed activation; or reduced or delayed clotting of platelets on the surface.

10. The method of claim 1, wherein the Neutral Beam is formed from a gas that consists essentially of any of: argon; a mixture of argon with $O_2$; a mixture of argon with $N_2$; or a mixture of argon with $CH_4$.

* * * * *